(12) United States Patent
Li

(10) Patent No.: US 6,322,954 B1
(45) Date of Patent: *Nov. 27, 2001

(54) WET INORGANIC AMMONIA ETCH OF ORGANICALLY MASKED SILICON-CONTAINING MATERIAL

(75) Inventor: Li Li, Meridian, ID (US)

(73) Assignee: Micron Technology, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/431,812

(22) Filed: Nov. 2, 1999

Related U.S. Application Data

(63) Continuation of application No. 08/947,559, filed on Oct. 9, 1997, now Pat. No. 5,976,767.

(51) Int. Cl.$^7$ .................................................... G03F 7/26
(52) U.S. Cl. .......................... 430/313; 216/99; 438/753
(58) Field of Search ..................................... 430/313, 323, 430/316; 216/99; 438/753

(56) References Cited

U.S. PATENT DOCUMENTS

| | | | |
|---|---|---|---|
| 4,172,005 | 10/1979 | Muraoka et al. | 156/647 |
| 4,362,599 | 12/1982 | Imaizumi et al. | 156/647 |
| 4,863,559 | 9/1989 | Douglas | 156/643 |
| 5,030,590 | 7/1991 | Amini et al. | 437/233 |
| 5,176,756 | 1/1993 | Nakashima et al. | 156/657 |
| 5,242,863 | 9/1993 | Xiang-Zheng et al. | 437/228 |
| 5,296,093 | 3/1994 | Szwejkowski et al. | 156/643 |
| 5,389,198 | 2/1995 | Koide et al. | 156/651 |
| 5,716,535 | 2/1998 | Lee et al. | 216/99 |
| 5,976,767 | * 11/1999 | Li | 430/313 |

* cited by examiner

Primary Examiner—Kathleen Duda

(74) Attorney, Agent, or Firm—Workman, Nydegger & Seeley

(57) ABSTRACT

The present invention relates to a process for selectively etching polysilicon utilizing an ammonia solution etchant that is selective to silicon dioxide and photoresist. In one embodiment of the inventive material, a polysilicon layer is formed over a semiconductor substrate. A photoresist layer is then formed over the polysilicon layer. A portion of the photoresist layer is selectively removed by an edge bead removal process along the edge of the semiconductor wafer so as to expose a portion of the polysilicon layer. The exposed polysilicon layer is selectively removed by an etch conducted at a temperature range from about 20° C. to about 30° C. with an ammonium hydroxide etchant having an ammonia concentration in the range of about 1% to about 5% by volume. The etch is selective to the photoresist layer. A second application of the inventive process is conducted upon a semiconductor substrate having thereon a silicon base layer, a pair of gate stacks each having a spacer thereon, a silicon dioxide layer formed upon the silicon base layer over the of gate stacks and defining therein a contact hole between the pair of gate stacks that terminates at the silicon base layer. A HSG polysilicon layer is formed over the silicon dioxide layer, within the contact hole and on the backside of the semiconductor substrate. A photoresist layer is then over the semiconductor substrate. A portion of the photoresist layer that is generally aligned with a pair of gate stacks proximate to the edge of the semiconductor substrate is removed using an edge bead removal process. The HSG polysilicon layer within the contact hole and on the back surface of the semiconductor substrate is then removed by etching using the ammonium hydroxide etch solution. The ammonium hydroxide etch solution will not substantially remove either of the silicon dioxide layer or the photoresist layer. Megasonics can be used with the ammonium hydroxide etch to selectively remove the HSG polysilicon layer at a faster rate.

36 Claims, 3 Drawing Sheets

WET INORGANIC AMMONIA ETCH OF ORGANICALLY MASKED SILICON-CONTAINING MATERIAL

RELATED APPLICATIONS

This application is a divisional of application Ser. No. 08/947,559, filed on Oct. 9, 1997, now U.S. Pat. No. 5,976,767, which is incorporated herein by reference.

BACKGROUND OF THE INVENTION

1. The Field of the Invention

The present invention involves a selective etching process that utilizes one of an organic masking material and a silicon dioxide layer as etch barriers during the selective etch of a layer of silicon containing material situated on a semiconductor substrate. More particularly, the present invention relates to a process for utilizing an ammonia chemistry etch system for selectively etching an area of a silicon containing material while one of an organic photoresist layer and a BPSG layer are not substantially etched.

2. The Relevant Technology

Modern integrated circuits are manufactured by an elaborate process in which a large number of electronic semiconductor devices are integrally formed on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

Conventional semiconductor devices which are formed on a semiconductor substrate include capacitors, resistors, transistors, diodes, and the like. In advanced manufacturing of integrated circuits, hundreds of thousands of these semiconductor devices are formed on a single semiconductor substrate. In order to compactly form the semiconductor devices, the semiconductor devices are formed on varying levels of the semiconductor substrate. This requires forming a semiconductor substrate with a topographical design.

Uniformity across a semiconductor device is a concern during the many process steps in the fabrication of a semiconductor device. One of the process steps in the manufacture of these multilayer structures is a chemical mechanical planarization (CMP) process. In the case of a semiconductor wafer subjected to a CMP process, the CMP process may not uniformly planarize a surface on the semiconductor wafer, particularly at along the circular edge of the semiconductor wafer where polishing can be the deepest across the wafer. As a result, an uneven surface is produced. In addition to the problem of uneven surfaces, the CMP may also over polish the semiconductor wafer so as to expose surfaces deep within. Over polishing may reduce yield and can potentially cause electrical shorts.

Commercialized silicon etchants include potassium hydroxide (KOH), tetramethal ammonium hydroxide ($(CH_4)_4N$—OH), and a mixture of water, hydrofluoric acid (HF), nitric acid ($HNO_3$), and acetic acid ($CH_3COOH$). Such etches, however, do not adequately address the foregoing problems. Additionally, conventional silicon etchants are selective neither to organic photoresist materials nor to silicon dioxide. When potassium (K) is in the etchant, contamination of the semiconductor wafer can result. Consequently, potassium hydroxide (KOH) is not used in some semiconductor laboratories. Also, the carbon chains of a $((CH_4)_4N$—OH) etchant render the organic etchant unselective to organic photoresist material.

It would be advantageous to identify a etchant for a silicon containing material, such as CSG polysilicon, HSG polysilicon, polysilicon, monocyrstalline silicon, and amorphous silicon, that is also selective to silicon dioxide and organic photoresist material.

SUMMARY OF THE INVENTION

The present invention relates to a process for selectively etching a silicon material utilizing an ammonia solution etch that is selective to a silicon dioxide layer and to an organic masking material, such as an organic photoresist layer. The silicon containing layer is substantially composed of materials selected from the group consisting of CSG polysilicon, HSG polysilicon, polysilicon, monocyrstalline silicon, and amorphous silicon. The silicon dioxide layer is substantially composed of materials selected from the group consisting of silicon dioxide ($SiO_2$), borophosphosilicate glass (BPSG), borosilicate glass (BSG), and phosphosilicate glass (PSG).

In one embodiment, a silicon containing layer is formed over a semiconductor wafer. A layer of organic masking material, such as an organic photoresist layer, is then formed over the silicon containing layer. A portion of the layer of organic masking material is selectively removed along the edge of the semiconductor wafer by an edge bead removal process, thereby exposing a portion of the silicon containing layer. The exposed portion of the silicon containing layer is selectively removed by an ammonium hydroxide etch solution without substantially removing the layer of organic masking material. The preferred etch process uses the ammonium hydroxide etch solution in a temperature range from about 20° C. to about 30° C. with an ammonia concentration in the range of about 1% to about 5% by volume. Megasonics can be used with the ammonium hydroxide etch to selectively remove the silicon containing layer at a faster rate.

A second application of the inventive process is conducted upon a semiconductor substrate having thereon a silicon base layer, a pair of gate stacks, each having a spacer thereon, and a silicon dioxide layer over the pair of gate stacks and the silicon base layer. The silicon dioxide layer has been selectively patterned and etched to define therein a contact hole terminating at the silicon base layer between the pair of gate stacks. A silicon containing layer is then formed over the pair of gate stacks and the silicon base layer including within the contact hole, as well as being formed upon the back surface of the semiconductor substrate opposite of the silicon base layer. A layer of organic masking material, such as an organic photoresist layer, is formed over the silicon containing layer that overlays the gate stacks. A portion of the organic masking material over a pair of gate stacks along the edge of the semiconductor substrate is selectively removed by an edge bead removal process. The removal of a portion of the organic masking material exposes a portion of the silicon containing layer. The exposed portion of the silicon containing layer and the silicon containing layer on the back surface of the semiconductor substrate are selectively removed using the ammonium hydroxide etch solution without substantially removing the silicon dioxide layer or the organic masking material.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not, therefore, to be considered to be limiting of its scope, the invention will be described and explained with additional specificity and detail through the use of the accompanying drawings in which.

DETAILED DESCRIPTION OF THE PREFERRED EMBODIMENTS

The inventive process herein is directed towards selectively utilizing an ammonia solution etch to selectively remove a silicon containing layer. The ammonia solution etch is selective to a silicon dioxide layer and an organic masking material such as a layer of organic photoresist.

Figure 1:
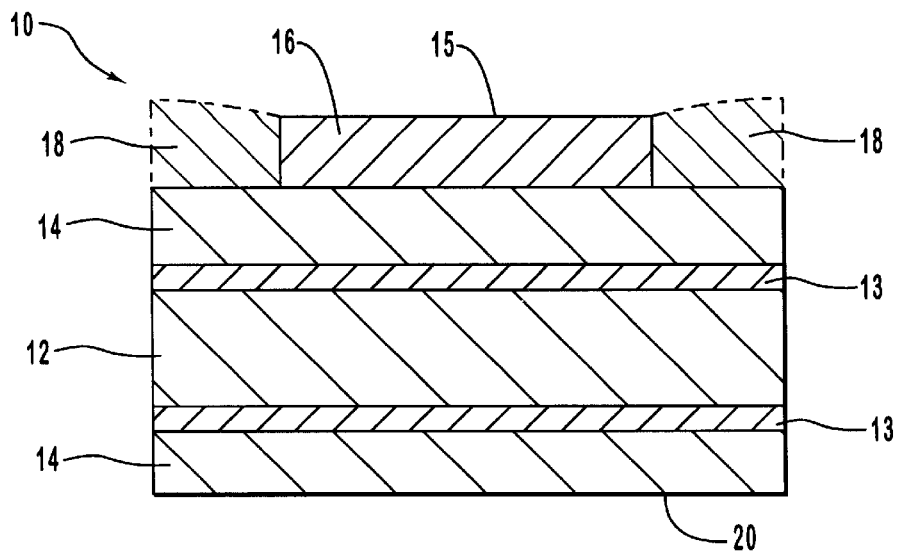
FIG. 1 is a partial cross-sectional elevation view of a semiconductor substrate having thereon a silicon base layer, an oxide layer, a silicon containing layer, and a photoresist layer where a portion of the photoresist layer shown in phantom is to be removed.

As illustrated in FIG. 1, a semiconductor substrate is generally shown at reference numeral 10 and includes a silicon base layer 12. An oxide layer 13 is formed over both sides of silicon base layer 12. Overlying oxide layer 13 on the upper side 15 of semiconductor substrate 10 is a silicon containing layer 14. Semiconductor substrate 10 may comprise various other layers disposed between silicon base layer 12 and silicon containing layer 14. The material that silicon containing layer 14 is substantially comprised of is selected from the group consisting of CSG polysilicon, HSG polysilicon, polysilicon, monocrystalline silicon, and amorphous silicon. In the embodiment shown in FIG. 1, silicon containing layer 14 comprises HSG polysilicon.

A layer of organic masking material, such as a photoresist layer 16 shown in FIG. 1, is now deposited over oxide layer 13. The term organic masking material encompasses polymers and epoxies, and particularly those having one or more molecular carbon chains. In addition, the organic masking material may or may not be photosensitive. As illustrated in FIG. 1, the process to form photoresist layer 16 results in a somewhat uneven thickness of photoresist layer 16 and particularly of edge portion 18. Photoresist layer 16 is thickest along the edge of semiconductor substrate 10 as shown by edge portion 18 of photoresist layer 16 of FIG. 1.

Figure 2:
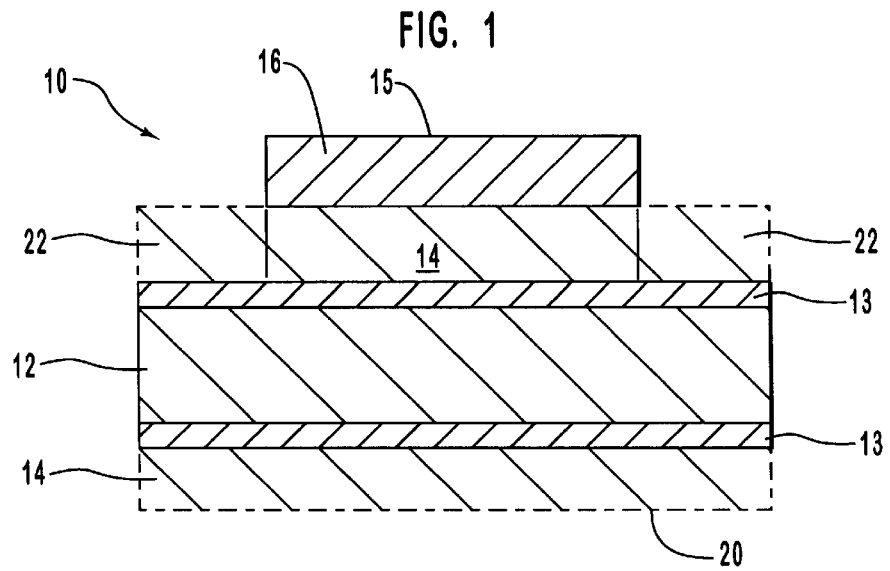
FIG. 2 is a partial cross-sectional elevation view of the structure of FIG. 1 wherein the portion of the photoresist layer shown in phantom in FIG. 1 has undergone an edge bead removal process exposing a portion of the silicon containing layer, and where the portion of the silicon containing layers shown in phantom are to be removed by an ammonia solution etch.

Photoresist layer 16 is then selectively removed to expose portions of silicon containing layer 14. Specifically, edge portion 18 of photoresist layer 16 is removed using an edge bead removal process along the edge of semiconductor substrate 10 as shown by the phantom lines in FIG. 1. As FIG. 2 shows, edge portion 18 of photoresist layer 16 has been removed by the edge bead removal process thereby exposing portions of silicon containing layer 14 along the edge of semiconductor substrate 10. Where semiconductor substrate 10 is a semiconductor wafer, edge portion 18 is substantially circular in shape around the edge of semiconductor wafer 10.

Material beneath edge portion 18 is to be removed because CMP tends to over polish along the edge of semiconductor substrate 10. The consequence of over polishing is that the remainder of the wafer may be rendered uneven. Thus, in order to prevent an uneven surface from being formed, the precautionary measure of edge bead removal is taken which allows portion 22 of silicon containing layer 14 to be removed along the edge of semiconductor substrate 10.

Semiconductor substrate 10 then subjected to an etch utilizing an ammonia ($NH_3$) solution chemical etch system to selectively remove portion 22 of silicon containing layer 14 that was exposed by the edge bead removal of edge portion 18 of photoresist layer 16. The ammonia solution etch also removes silicon containing layer 14 on a back surface 20 of semiconductor substrate 10. Portion 22 of silicon containing layer 14 and silicon containing layer 14 on back surface 20 of semiconductor substrate 10 that will be selectively removed by the ammonia solution chemical etch are shown in FIG. 2 as phantom lines. The removal of silicon containing layer 14 on back surface 20 of semiconductor substrate 10 helps to remove any contaminates therein.

The ammonia solution chemical etch system utilized in the present inventive method comprises an ammonium hydroxide ($NH_4OH$) etch solution. The ammonium hydroxide etch solution may have various concentrations of ammonia ($NH_3$). The preferred concentration of ammonia is in the range of one (1) to five (5) percent by volume. The ammonia solution comprises ammonia and a substance that is not a solvent for photoresist. The preferred embodiment of the ammonium hydroxide is aqueous and can be formed using ammonia either in liquid or gaseous form and water. It is preferred that the water be deionized water. The preferred process parameters for the etch is a temperature for the ammonium hydroxide etch solution in a range from about 20° C. to about 30° C.

Figure 3:
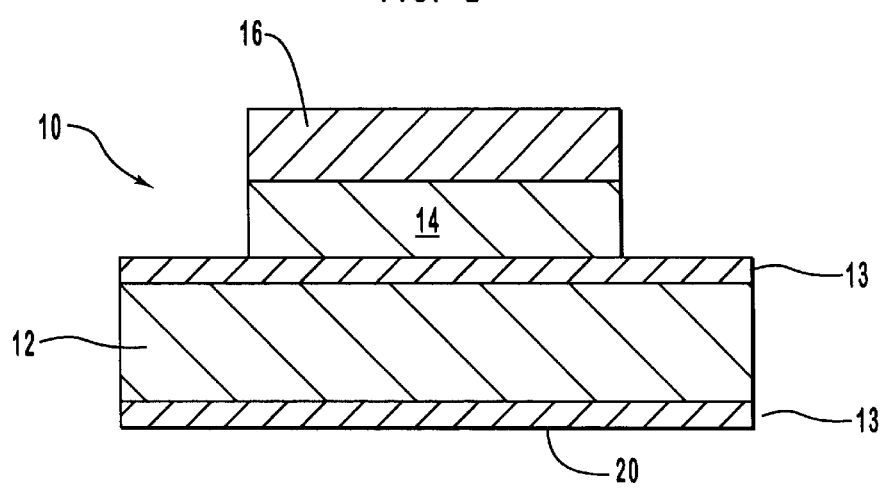
FIG. 3 is a partial cross-sectional elevation view of the semiconductor substrate of FIG. 1 after undergoing the ammonia solution etch to remove the portions of the silicon containing layers shown in phantom in FIG. 2.

FIG. 3 illustrates semiconductor substrate 10 upon completion of the novel etch process. Semiconductor substrate 10 continues processing as required after completion of the novel etch process. The remainder of photoresist layer 16 can be conventionally removed, such as by an abrasive planarizing process, for example CMP.

Another application of the inventive process is to use an ammonia solution etch to selectively remove a silicon containing material without substantially removing silicon dioxide material or organic masking material. Such an application is illustrated as a process conducted upon a semiconductor substrate 40 shown in FIG. 4.

Figure 4:
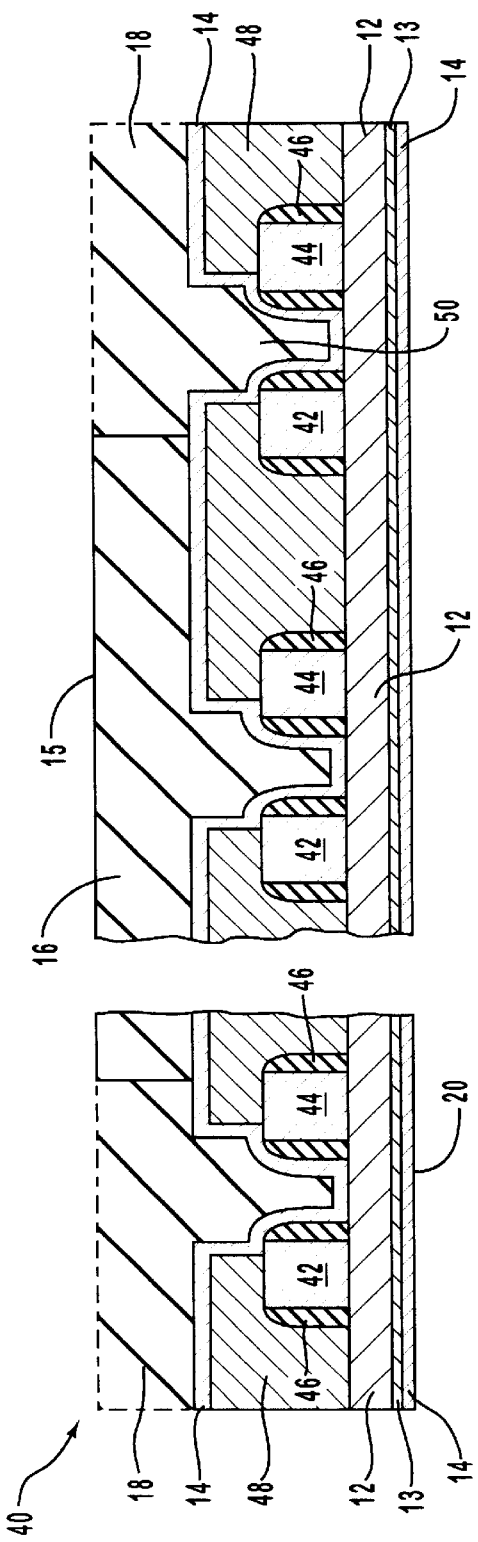
FIG. 4 is a partial cross-sectional elevation view of a semiconductor substrate having thereon a silicon base layer, an oxide layer, a pair of gate stacks, a silicon dioxide layer upon the silicon base layer and upon the pair of gate stacks, the silicon dioxide layer defining therein a contact hole terminating at the silicon base layer between the pair of gate stacks, wherein the contact hole is lined with a layer of silicon material that also covers the backside of the semiconductor substrate, wherein the contact hole is substantially filled with an organic masking material that is also situated upon the silicon dioxide layer and where the portion of the organic photoresist layer shown in phantom is to be removed.
Figure 5:
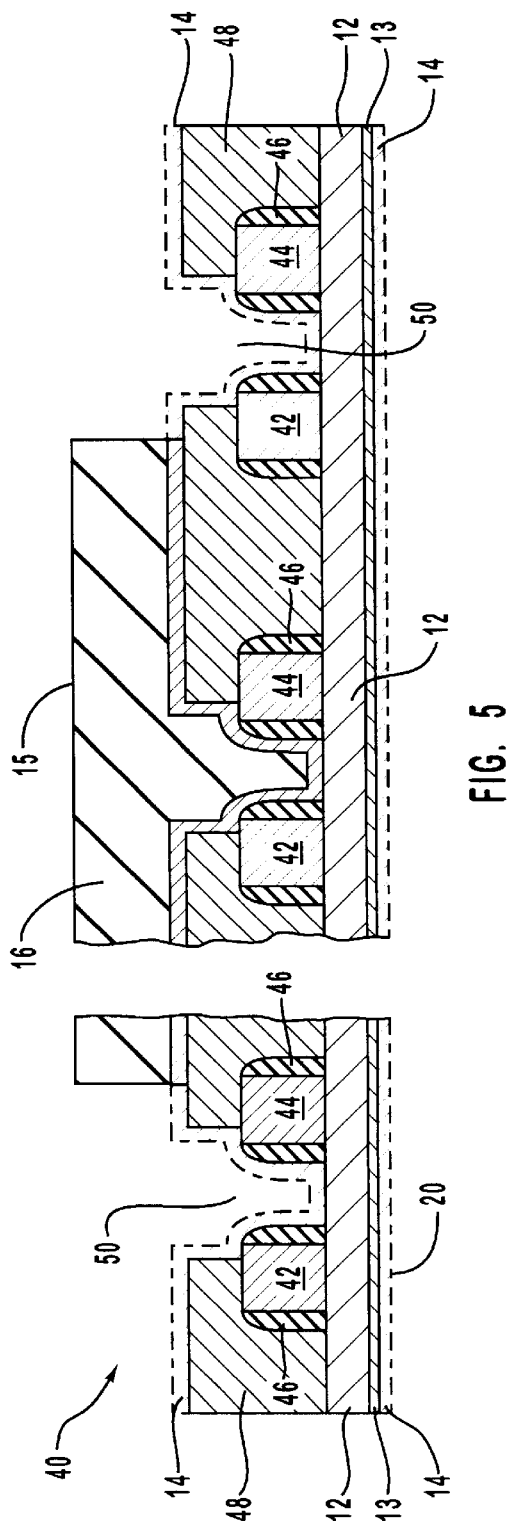
FIG. 5 is a partial cross-sectional elevation view of the structure of FIG. 4 after the portion of the organic photoresist shown in phantom in FIG. 1 has undergone an edge bead removal process exposing a pair of gate stacks proximate to the edge of the semiconductor substrate, and where the portions of the silicon containing layer shown in phantom are being removed from the semiconductor substrate by an ammonia solution etch.
Figure 6:
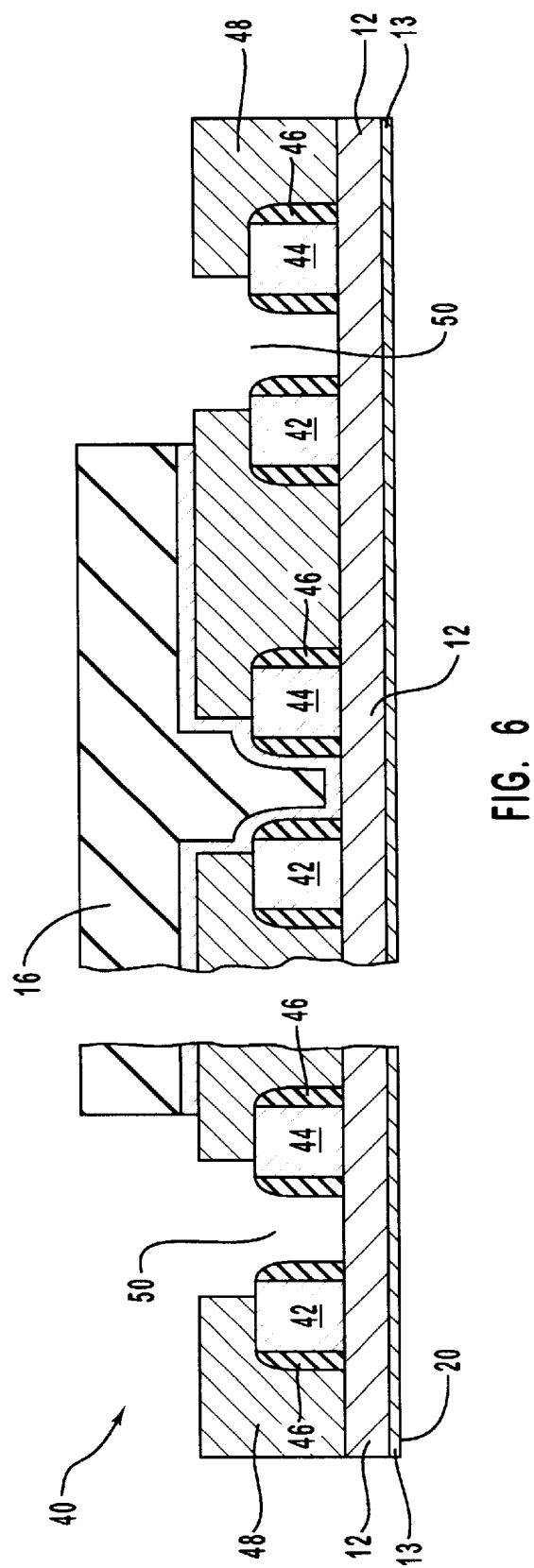
FIG. 6 is a partial cross-sectional elevation view of the structure of FIG. 5 after undergoing the ammonia etch which removed portions of the silicon containing layers shown in phantom in FIG. 5.

Semiconductor substrate 40 includes silicon base layer 12 with an oxide layer 13 formed on back surface 20 thereof. Base silicon layer 12 is substantially composed of material selected from a group consisting polysilicon, monocrystalline silicon, and amorphous silicon. Preferably, base silicon layer 12 is substantially composed of monocrystalline silicon. Gate stacks 42, 44 are formed on oxide layer 13 on top side 15 of semiconductor substrate 40 and each gate stack 42, 44 has formed thereon a spacer 46. Semiconductor substrate 40 may have any number of pairs of gate stacks 42, 44 formed thereon. By way of example and not limitation, only pairs of gate stacks 42, 44 along the edge of semiconductor substrate 40 and a pair of gate stacks 42, 44 towards the center of semiconductor substrate 40 are illustrated in FIGS. 4–6. It can be appreciated that other numbers and configurations of pairs of gate stacks 42, 44 may be used.

A silicon dioxide layer 48 has been formed over gate stacks 42, 44 by conventional methods. Silicon dioxide layer 48 is substantially composed of material selected from the group comprising silicon dioxide ($SiO_2$), borophosphosilicate glass (BPSG), borosilicate glass (BSG), and phosphosilicate glass (PSG). Preferably, silicon dioxide layer 48 is substantially composed of BPSG. A contact hole 50 is defined in silicon dioxide layer 48 utilizing conventional techniques and terminates upon silicon base layer 12 between gate stacks 42, 44.

As shown in FIG. 4, substantially overlying silicon dioxide layer 48 and gate stacks 42, 44 within contact hole 50 is silicon containing layer 14. Silicon containing layer 14 is also formed on back surface 20 of semiconductor substrate 40. As with the embodiment illustrated in FIG. 1, silicon containing layer 14 is substantially composed of material selected from a group consisting CSG polysilicon, HSG polysilicon, polysilicon, monocrystalline silicon, and amorphous silicon. Preferably, silicon containing layer 14 is substantially composed of HSG polysilicon.

After silicon containing layer 14 is formed, a layer of an organic masking material, such as photoresist layer 16, is formed upon silicon containing layer 14 on upper side 15 of semiconductor substrate 40 so as to substantially fill contact hole 50. As shown in phantom in FIG. 4, edge portion 18 of photoresist layer 16 will be removed using an edge bead removal process.

FIG. 5 illustrates semiconductor substrate 40 after completion of the edge bead removal process that removes edge portion 18 of photoresist layer 16 shown in phantom in FIG. 4 along the edge of semiconductor substrate 40. Removal of edge portion 18 of photoresist layer 16 exposes a pair of gate stacks 42, 44 proximate to the edge of semiconductor substrate 40. FIG. 5 shows the portions 47 of silicon containing layer 14 exposed by the edge bead removal process that will be removed by chemical etch in phantom. Semiconductor substrate 40 is then subjected to an etch utilizing an ammonia ($NH_3$) solution chemical etch system, such as an ammonium hydroxide ($NH_4OH$) etch solution as discussed above.

As shown in FIG. 6, portions 47 of silicon containing layer 14 over gate stacks 42, 44 exposed by the edge bead removal process are removed by the ammonia etch. Silicon containing layer 14 on back surface 20 of semiconductor substrate 40 is also removed by the ammonia etch.

The ammonia solution chemical etchant is selective to silicon dioxide layer 48 as well as photoresist layer 16 which is substantially composed of an organic material. The removal of silicon containing layer 14 on back surface 20 of semiconductor substrate 40 helps to remove any contamination therein.

The ammonium hydroxide etch removes exposed portion 44 of silicon containing layer 14 and silicon containing layer 14 on back surface 20 of semiconductor substrate 40 that are both shown in phantom in FIG. 5 but leaves silicon dioxide layer 48 and any photoresist layer 16 substantially untouched as shown in FIG. 6. In summary, the ammonia solution etch is selective to a silicon dioxide layer 48 and to organic masking materials, such as photoresist layer 16. The ammonia etch can also be used with megasonics which cause sound waves to travel through the solution and help remove particles. Megasonics used with an etch combines chemical forces and physical forces. The combination of megasonics with an ammonia solution increases the material removal rate of the ammonia solution etch.

Semiconductor substrate 40 may now continue with normal processing as required in the formation of a conventional semiconductor device including removing the remainder of photoresist layer 16 using conventional photoresist removal techniques such as etching or ashing and CMP processing.

Conventional additional processing may be done in a fabrication process of semiconductor substrates 10 and 40. The inventive process may be applied to other structures associated with a semiconductor substrate.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for selectively removing silicon-containing material comprising:

forming a layer of organic masking material upon a layer of silicon-containing material;

selectively removing a portion of said layer of organic masking material to expose a portion of said layer of silicon-containing material, wherein said exposed portion of said layer of silicon-containing material is composed of material selected from the group consisting of CSG polysilicon, HSG polysilicon, polysilicon, monocrystalline silicon, and amorphous silicon; and etching said exposed portion of said layer of silicon-containing material with a liquid inorganic ammonia etchant solution in a temperature range from about 20° C. to about 30° C., wherein said etching is selective to said layer of organic masking material.

2. A process as recited in claim 1, wherein said layer of silicon-containing material has an exposed back surface opposite to a side thereof having thereon said layer of organic masking material, and wherein etching said exposed portion of said layer of silicon-containing material further comprises selectively removing said layer of silicon-containing material on said exposed back surface with said liquid inorganic ammonia etchant solution.

3. A process as recited in claim 1, wherein said liquid inorganic ammonia etchant solution comprises an ammonium hydroxide solution.

4. A process as recited in claim 3, wherein the ammonium hydroxide in said ammonium hydroxide solution is in solution with deionized water.

5. A process as recited in claim 1, wherein said layer of organic masking material is composed of photoresist.

6. A process as recited in claim 1, wherein said exposed portion of said layer of silicon-containing material includes an edge at which said layer of silicon-containing material terminates.

7. A process as recited in claim 6, wherein said layer of silicon-containing material is situated upon a semiconductor wafer.

8. A process as recited in claim 7, wherein said edge at which said layer of silicon-containing material terminates is a circular periphery of the semiconductor wafer.

9. A process as recited in claim 3, wherein said ammonium hydroxide solution has an ammonia concentration in the range from about 1% by volume to about 5% by volume.

10. A process as recited in claim 1, wherein:
said etching is selective to an exposed silicon dioxide layer situated upon a semiconductor substrate; and
said layer of silicon-containing material is situated upon said semiconductor substrate.

11. A process as recited in claim 10, wherein said exposed silicon dioxide layer is composed of material selected from the group consisting of silicon dioxide, borophosphosilicate glass, borosilicate glass, and phosphosilicate glass.

12. A process for selectively removing silicon-containing material comprising:
providing a semiconductor substrate having thereon a layer of silicon-containing material, said silicon-containing material being selected from the group consisting of CSG polysilicon, HSG polysilicon, polysilicon, monocrystalline silicon, and amorphous silicon, and an exposed layer of organic masking material;
selectively exposing a portion of said layer of said silicon-containing material to form an exposed portion of silicon-containing material and unexposed silicon-containing material; and
selectively removing said exposed portion of silicon-containing material with an inorganic ammonia etchant solution in a temperature range from about 20° C. to about 30° C., wherein a layer of organic masking material is left on said unexposed silicon-containing material.

13. A process as recited in claim 12, wherein said layer of silicon-containing materials includes an edge at which said layer of silicon-containing material terminates.

14. A process as recited in claim 13, wherein:
said layer of silicon-containing material is situated upon a semiconductor substrate; and
said edge at which said layer of silicon-containing material terminates is around a periphery of said semiconductor substrate.

15. A process as recited in claim 12, wherein:
said semiconductor substrate has a back surface;
said back surface has an exposed layer of silicon-containing material formed thereon; and
said inorganic ammonia etchant solution etches said exposed layer of silicon-containing material on said back surface of said semiconductor substrate.

16. A process for selectively removing silicon-containing material comprising:
providing a semiconductor substrate having thereon:
a layer of silicon-containing material, said silicon-containing material being selected from the group consisting of CSG polysilicon, HSG polysilicon, polysilicon, monocrystalline silicon, and amorphous silicon;
a layer of organic masking material;
an exposed silicon dioxide layer; and
wet etching said layer of silicon-containing material with an inorganic ammonia etchant solution in a temperature range from about 20° C. to about 30° C., wherein said wet etching is selective to both said layer of organic masking material and said exposed silicon dioxide layer.

17. A process as recited in claim 16, wherein:
said semiconductor substrate has a back surface opposite to a side thereof having thereon said layer of organic masking material;
wet etching said layer of silicon-containing material further comprises:
selectively removing a portion of said back surface of said semiconductor substrate with said inorganic ammonia etchant solution, wherein said portion of said back surface of said semiconductor substrate is composed of a material selected from the group consisting of CSG polysilicon, HSG polysilicon, polysilicon, monocrystalline silicon, and amorphous silicon.

18. A process as recited in claim 16, wherein:
wet etching said layer of silicon-containing material is a wet etch process; and
said inorganic ammonia etchant solution is composed of ammonium hydroxide in solution with deionized water and having an ammonia concentration in the range from about 1% by volume to about 5% by volume.

19. A process as recited in claim 16, wherein:
said portion of said layer of silicon-containing material is situated upon a semiconductor wafer; and
the semiconductor wafer has a circular portion periphery.

20. A process for selectively removing silicon-containing material comprising:
providing a semiconductor substrate having thereon:
a layer of silicon-containing material, said silicon-containing material being selected from the group consisting of CSG polysilicon, HSG polysilicon, polysilicon, monocrystalline silicon, and amorphous silicon; and
a layer of organic masking material;
selectively exposing a portion of said layer of silicon-containing material in a circular portion around a periphery thereof; and
wet etching said selectively exposed portion of said layer of silicon-containing material with an inorganic ammonia etchant having an ammonia concentration in the range of about 1% to about 5% by volume in a solution of deionized water in a temperature range from about 20° C. to about 30° C., wherein said wet etching is selective to said layer of organic masking material.

21. A process as recited in claim 20, wherein:
said semiconductor substrate has a back surface;
said layer of silicon-containing material is situated upon said back surface of said semiconductor substrate; and
wet etching said selectively exposed portion of said layer of silicon-containing material selectively removes a portion of said layer of silicon-containing material.

22. A process for selectively removing silicon-containing material comprising:
providing a semiconductor substrate having a periphery, said semiconductor substrate having thereon:
a silicon-containing material base layer;
a silicon-containing material back surface layer on an opposite side of said semiconductor substrate than said silicon-containing material base layer;
a pair of gate stacks;
a silicon dioxide layer over said pair of gate stacks and said silicon base layer, said silicon dioxide layer defining therein a contact hole terminating at said silicon base layer between said pair of gate stacks;
a silicon-containing material lining layer within the contact hole and upon both of said pair of gate stacks and said silicon base layer;
a layer of organic masking material upon said silicon dioxide layer and said silicon-containing material lining layer so as to fill the contact hole defined within said silicon dioxide layer;
selectively removing a portion of said layer of organic masking material along said periphery of said semiconductor substrate thereby exposing a portion of said silicon-containing material lining layer, wherein said silicon-containing material liner layer is composed of material selected from the group consisting of CSG polysilicon, HSG polysilicon, polysilicon, monocrystalline silicon, and amorphous silicon; and
etching both said exposed silicon-containing material lining layer and said silicon-containing material back surface layer with a liquid inorganic ammonia etchant solution in a temperature range from about 20° C. to about 30° C., wherein said etchant solution is selective to said layer of organic masking material.

23. A process as recited in claim 22, wherein said etchant solution is selective to said silicon dioxide layer.

24. A process as recited in claim 22, wherein said exposed portion of said silicon-containing material lining layer is aligned with said pair of gate stacks.

25. A process as recited in claim 22, wherein said exposed portion of said silicon-containing material liner layer is circular in shape.

26. A process as recited in claim 22, wherein said silicon-containing material back surface layer is composed of material selected from the group consisting of CSG polysilicon, HSG polysilicon, polysilicon, monocrystalline silicon, and amorphous silicon.

27. A process for selectively removing silicon-containing material comprising:
providing a semiconductor substrate having a periphery, said semiconductor substrate having thereon:
a silicon-containing material base layer;
a silicon-containing material back surface layer on an opposite side of the semiconductor substrate than the silicon-containing material base layer, wherein said silicon-containing material back surface layer is composed of material selected from the group consisting of CSG polysilicon, HSG polysilicon, polysilicon, monocrystalline silicon, and amorphous silicon;
a pair of gate stacks;
a silicon dioxide layer over said pair of gate stacks and said silicon base layer, said silicon dioxide layer defining therein a contact hole terminating at said silicon base layer between said pair of gate stacks, wherein said silicon dioxide layer is composed of material selected from the group consisting of silicon dioxide, borophosphosilicate glass, borosilicate glass, and phosphosilicate glass;
a silicon-containing material lining layer within said contact hole and upon both of said pair of gate stacks and said silicon base layer;
a layer of photosensitive organic masking material upon said silicon dioxide layer and said silicon-containing material lining layer so as to fill said contact hole defined within said silicon dioxide layer;
selectively removing a portion of said layer of photosensitive organic masking material along said periphery of said semiconductor substrate, thereby exposing a portion of said silicon-containing material lining layer, said exposed portion of said silicon-containing material layer being aligned with said pair of gate stacks along said periphery of said semiconductor substrate; and
exposing said semiconductor substrate to a liquid inorganic ammonia etchant solution to etch, wherein:
said etch etches both said exposed portion of said silicon-containing material lining layer and said silicon-containing material back surface layer;
said etch is selective to both said layer of photosensitive organic masking material and said silicon dioxide layer; and
said liquid inorganic ammonia etchant solution has an ammonia concentration in a range from about 1% to about 5% by volume in solution with deionized water.

28. The processes recited in claim 27, wherein said exposed portion of said silicon-containing material layer is circular in shape.

29. A process as recited in claim 27, wherein said silicon-containing material liner layer is composed of material selected from the group consisting of CSG polysilicon, HSG polysilicon, polysilicon, monocrystalline silicon, and amorphous silicon.

30. A method for removing silicon-containing material from a semiconductor structure that includes a semiconductor substrate having thereon a silicon-containing material base layer, a silicon-containing material back surface layer on an opposite side of the semiconductor substrate than the silicon-containing material base layer, a pair of gate stacks, a silicon dioxide layer over said pair of gate stacks and said silicon base layer, said silicon dioxide layer defining therein a contact hole terminating at said silicon base layer between said pair of gate stacks, a silicon-containing material lining layer within said contact hole and upon both of said pair of gate stacks and said silicon base layer, and a layer of photosensitive organic masking material upon said silicon dioxide layer and said silicon-containing material lining layer so as to fill said contact hole defined within said silicon dioxide layer, said method comprising:
selectively removing a portion of said layer of photosensitive organic masking material to expose a portion of said silicon-containing material lining layer that is aligned with said pair of gate stacks; and
etching said semiconductor substrate with a liquid inorganic ammonia etchant, wherein said etchant:
etches both said exposed portion of said silicon-containing material lining layer and said silicon-containing material back surface layer; and
is selective to both:
said layer of photosensitive organic masking material; and
said silicon dioxide layer.

31. The method as recited in claim 30, wherein said exposed portion of said silicon-containing material layer is circular in shape.

32. A method as recited in claim 30, wherein said silicon-containing material liner layer is composed of material selected from the group consisting of CSG polysilicon, HSG polysilicon, polysilicon, monocrystalline silicon, and amorphous silicon.

33. A method as recited in claim 30, wherein said silicon-containing material back surface layer is composed of material selected from the group consisting of CSG polysilicon, HSG polysilicon, polysilicon, monocrystalline silicon, and amorphous silicon.

34. A method as recited in claim 30, wherein said silicon dioxide layer is composed of material selected from the group consisting of silicon dioxide, borophosphosilicate glass, borosilicate glass, and phosphosilicate glass.

35. A method as recited in claim 30, wherein said liquid inorganic ammonia etchant solution has an ammonia concentration in a range from about 1% to about 5% by volume in solution with deionized water.

36. A method as recited in claim 30, wherein:

said semiconductor substrate has a periphery; and selectively removing a portion of said layer of photosensitive organic masking material to expose a portion of said silicon-containing material lining layer that is aligned with said pair of gate stacks further comprises:
removing said portion of said layer of photosensitive organic masking material along said periphery of said semiconductor substrate so as to expose said exposed portion of said silicon-containing material lining layer that is aligned with said pair of gate stacks along said periphery of said semiconductor substrate.

\* \* \* \* \*